United States Patent
Fang et al.

(10) Patent No.: US 11,282,845 B2
(45) Date of Patent: Mar. 22, 2022

(54) SEMICONDUCTOR DEVICES COMPRISING CARBON-DOPED SILICON NITRIDE AND RELATED METHODS

(71) Applicant: Micron Technology, Inc., Boise, ID (US)

(72) Inventors: Jun Fang, Boise, ID (US); Fei Wang, Boise, ID (US); Saniya Rathod, Boise, ID (US); Rutuparna Narulkar, Boise, ID (US); Matthew Park, Boise, ID (US); Matthew J. King, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/685,690

(22) Filed: Aug. 24, 2017

(65) Prior Publication Data

US 2019/0067306 A1    Feb. 28, 2019

(51) Int. Cl.
| | | |
|---|---|---|
| *H01L 27/11521* | (2017.01) | |
| *H01L 27/11551* | (2017.01) | |
| *H01L 27/11541* | (2017.01) | |
| *H01L 21/768* | (2006.01) | |
| *H01L 27/11548* | (2017.01) | |
| *H01L 27/11575* | (2017.01) | |

(52) U.S. Cl.
CPC .. *H01L 27/11521* (2013.01); *H01L 21/76829* (2013.01); *H01L 27/11541* (2013.01); *H01L 27/11548* (2013.01); *H01L 27/11551* (2013.01); *H01L 27/11575* (2013.01)

(58) Field of Classification Search
CPC .............. H01L 21/0217; H01L 21/318; H01L 27/11507; H01L 21/76816; H01L 21/76829; H01L 27/11548; H01L 27/11575; H01L 27/11568; H01L 27/11521
See application file for complete search history.

(56) References Cited

U.S. PATENT DOCUMENTS

| | | | |
|---|---|---|---|
| 6,251,802 B1 * | 6/2001 | Moore | ................ H01L 21/3146 438/778 |
| 7,799,672 B2 | 9/2010 | Hashimoto et al. | |
| 8,928,149 B2 | 1/2015 | Chen | |
| 9,142,455 B2 | 9/2015 | Kim et al. | |
| 9,236,392 B1 * | 1/2016 | Izumi | ................ H01L 27/11575 |
| 9,406,609 B1 * | 8/2016 | Lung | ................ H01L 21/76816 |
| 9,419,013 B1 | 8/2016 | Lee et al. | |

(Continued)

*Primary Examiner* — John A Bodnar
(74) *Attorney, Agent, or Firm* — TraskBritt

(57) ABSTRACT

A semiconductor device structure that comprises tiers of alternating dielectric levels and conductive levels and a carbon-doped silicon nitride over the tiers of the staircase structure. The carbon-doped silicon nitride excludes silicon carbon nitride. A method of forming the semiconductor device structure comprises forming stairs in a staircase structure comprising alternating dielectric levels and conductive levels. A carbon-doped silicon nitride is formed over the stairs, an oxide material is formed over the carbon-doped silicon nitride, and openings are formed in the oxide material. The openings extend to the carbon-doped silicon nitride. The carbon-doped silicon nitride is removed to extend the openings into the conductive levels of the staircase structure. Additional methods are disclosed.

27 Claims, 9 Drawing Sheets

(56) References Cited

U.S. PATENT DOCUMENTS

| | | |
|---|---|---|
| 9,437,483 B2 | 9/2016 | Lee et al. |
| 9,520,402 B1 | 12/2016 | Haller et al. |
| 2006/0228903 A1* | 10/2006 | McSwiney ............ C23C 16/308 |
| | | 438/778 |
| 2008/0124946 A1* | 5/2008 | Xiao .................... C23C 16/345 |
| | | 438/784 |
| 2010/0207240 A1* | 8/2010 | Hashimoto ....... H01L 27/11578 |
| | | 257/532 |
| 2011/0031630 A1* | 2/2011 | Hashimoto ....... H01L 27/11578 |
| | | 257/774 |
| 2011/0199813 A1 | 8/2011 | Yoo et al. |
| 2013/0234232 A1 | 9/2013 | Yahashi |
| 2014/0021632 A1 | 1/2014 | Lee et al. |
| 2014/0054789 A1 | 2/2014 | Chiu et al. |
| 2014/0367762 A1* | 12/2014 | Tian ................. H01L 29/66825 |
| | | 257/321 |
| 2015/0104954 A1* | 4/2015 | Pore ................... H01L 21/0217 |
| | | 438/778 |
| 2015/0325587 A1 | 11/2015 | Chen |
| 2016/0133531 A1 | 5/2016 | Yi et al. |
| 2017/0117222 A1* | 4/2017 | Kim ................. H01L 21/76829 |

\* cited by examiner

SEMICONDUCTOR DEVICES COMPRISING CARBON-DOPED SILICON NITRIDE AND RELATED METHODS

TECHNICAL FIELD

Embodiments disclosed herein relate to fabrication of semiconductor device structures, such as semiconductor device structures including staircase structures, and to methods of forming the semiconductor device structures. More particularly, embodiments of the disclosure relate to semiconductor device structures having the staircase structures and comprising carbon-doped silicon nitride and having contacts of different depths and to methods of forming the semiconductor device structures.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to implement vertical memory array (also referred to as a "three-dimensional (3D) memory array") architectures. A conventional vertical memory array includes transistor/memory-cell pillars extending through tiers of conductive structures and insulative structures. The tiers include alternating conductive structures and insulative structures, where the conductive structures function as control gates. Such a configuration permits a greater number of transistors to be located in a unit of die area by building the array upwards (e.g., longitudinally, vertically) on a die, as compared to structures with conventional planar (e.g., two-dimensional) arrangements of transistors.

The conventional vertical memory arrays include electrical connections between the conductive structures and access lines (e.g., word lines) so that memory cells in the vertical memory array can be uniquely selected for writing, reading, or erasing operations. One method of forming such an electrical connection includes forming a so-called "staircase" structure having so-called "stairs" at edges (e.g., lateral ends) of the conductive structures. The stairs are formed by repeatedly trimming and etching exposed regions of the conductive structures. The stairs define contact regions upon which contacts are formed to provide electrical access to the conductive structures. Given the stair-like profile, the conductive structures include both shallower conductive structures and the deeper conductive structures.

To provide electrical connections to both the shallower conductive structures and the deeper conductive structures, openings having different depths are formed through the conductive structures and insulative structures. Since the conductive structures are located at different depths, the openings are formed at various depths to contact (e.g., land on) the individual stairs. To ensure that the openings are formed to the desired depths, an etch process is conducted to form the openings down to the deeper conductive structures. However, the amount of time and other conditions of the etch process increase the likelihood that the openings to the shallower conductive structures will be overetched (e.g., punch through) into the conductive structures. Adjustments to etch chemistries used in the etch process have not sufficiently addressed this problem. Additionally, punch through of the shallower conductive structures is more likely to occur where a void or grain boundary is present in the conductive structures. As the number of tiers in the semiconductor devices increases and the conductive structures become thinner, multiple masks may be used to form the openings with the different depths, preventing the punch through of the shallower conductive structures. However, using the multiple masks adds additional processing acts, complexity, and cost to the overall process.

DETAILED DESCRIPTION

Figure 1:
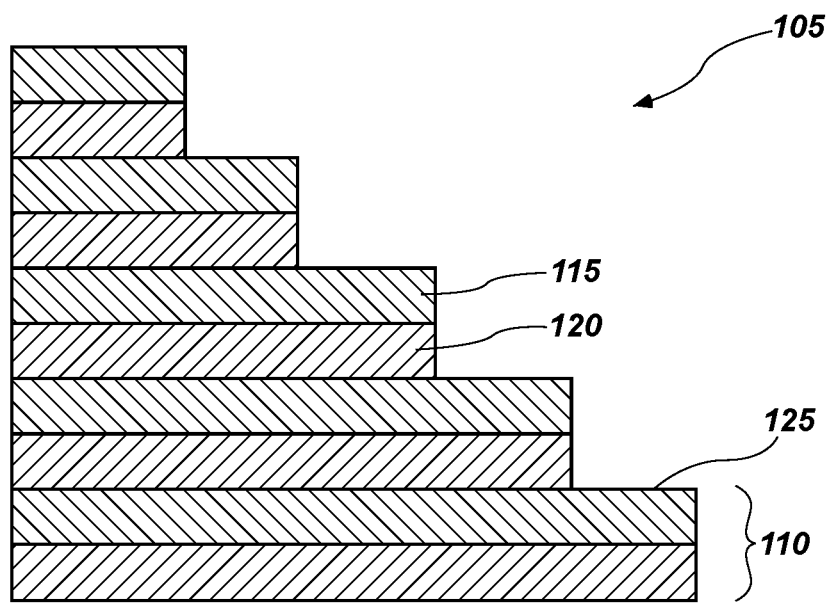
FIGS. 1-6 are cross-sectional views showing the fabrication process of a staircase structure in accordance with some embodiments of the disclosure.

Staircase structures having contacts of different heights and that are electrically connected to conductive materials at different depths are described. Methods of forming the contacts to electrically connect with the conductive materials that are positioned at different depths on a semiconductor device structure are also disclosed. The methods utilize an etch stop material to enable the contacts to contact (e.g., land on) the conductive materials at desired levels. The etch stop material is resistant to etch chemistries used in the formation of the contacts, such as resistant to wet etch chemistries and dry etch chemistries used to form the contacts. The etch stop material is also selectively etchable relative to specific other materials in the semiconductor device structure. In some embodiments, the etch stop material is a silicon nitride material, such as a carbon-doped silicon nitride material. The methods of the disclosure are used to form 3D semiconductor device structures including one or more staircase structures, such as 3D NAND Flash memory devices, which include, but are not limited to, 3D floating gate NAND Flash memory devices or 3D replacement gate NAND Flash memory devices.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device structure or a complete process flow for manufacturing semiconductor device structures and the structures described below do not form a complete semiconductor device structure. Only those process acts and structures necessary to understand the embodiments described herein are described in detail below. Additional acts to form a complete semiconductor device structure may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "staircase structure" means and includes a semiconductor structure including tiers of alternating dielectric levels, e.g., oxide levels, oxide materials, and nitride materials on a substrate, with the tiers having a stepped profile. The stepped profile is formed by patterning edges, such as peripheral edges, of the tiers. The staircase structure may, alternatively, include tiers of alternating dielectric levels, e.g., oxide levels, oxide materials, and conductive levels, e.g., conductive materials, on a substrate and having the stepped profile.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. One or more of the materials may be thermally sensitive. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the term "carbon-doped silicon nitride" means and includes silicon nitride (SiN) having carbon incorporated therein. The carbon is present in the silicon nitride at from about 1% by weight (wt %) to about 30 wt %. The carbon-doped silicon nitride differs from silicon carbon nitride (SiCN), which includes a stoichiometric amount of carbon, such as $Si_{1.5}C_{1.5}N_4$. The carbon-doped silicon nitride excludes silicon carbon nitride having a stoichiometric amount of carbon. Thus, the carbon-doped silicon nitride may include from about 1% wt % of carbon to less than about a stoichiometric amount of carbon.

As used herein, the term "selectively etchable" means and includes a material that has an etch rate that is at least about two times (2×) greater than the etch rate of another material, such as about five times (5×) greater, about ten times (10×) greater, about twenty times (20×) greater, or about forty times (40×) greater relative to the etch rate of the another material.

As shown in FIG. 1, the staircase structure 105 includes tiers 110 of alternating oxide materials 115 and nitride materials 120 on the substrate (not shown). The alternating oxide materials 115 and nitride materials 120 are formed on the substrate and the tiers 110 are patterned to form so-called "stairs" 125 of the staircase structure 105. By conducting repeated etch and trim acts, the stepped profile (e.g., stairs 125) of the staircase structure 105 is formed. The formation and patterning of the oxide materials 115 and nitride materials 120 are conducted by conventional techniques and are not described in detail herein. The oxide materials 115 and the nitride materials 120 are selected to be selectively etchable relative to one another. The oxide material 115 may include, but is not limited to, a silicon oxide ($SiO_x$), such as silicon dioxide ($SiO_2$), phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof. In one embodiment, the oxide material 115 is a silicon oxide ($SiO_x$), such as silicon dioxide ($SiO_2$), and the nitride material 120 is silicon nitride (SiN).

Figure 2:
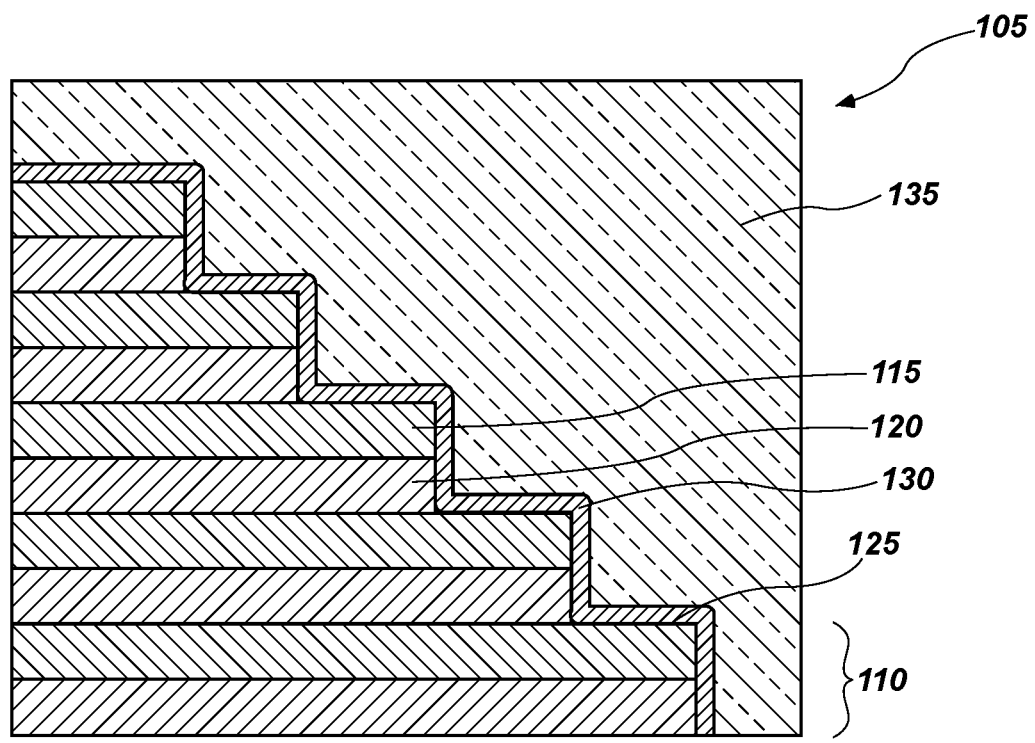

An etch stop material 130 may be formed over exposed horizontal and exposed vertical surfaces of the oxide materials 115 and nitride materials 120, as shown in FIG. 2. The etch stop material 130 may, thus, exhibit a stepped profile over the stairs 125. The etch stop material 130 may be formed by conventional techniques including, but not limited to, chemical vapor deposition (CVD), physical vapor deposition (PVD), atomic layer deposition (ALD), or a diffusion process. The etch stop material 130 may be any material that is not substantially removed (e.g., etched) during removal and replacement of the nitride materials 120 of the staircase structure 105. By way of example only, the etch stop material 130 may be formed from the carbon-doped silicon nitride, which is not substantially removed during removal of the nitride materials 120 of the staircase structure 105. The etch stop material 130 may exhibit a substantially zero etch rate in an etch chemistry used to remove the nitride materials 120 of the staircase structure 105, such as in a phosphorus-based wet etch chemistry. The etch stop material 130 may also be substantially resistant to dry etch chemistries used to form openings 145 (see FIG. 5). The etch stop material 130 may, however, be etchable to form contact holes 150 (see FIG. 6) in which contacts 155 (see FIG. 6) are subsequently formed.

The etch stop material 130 may be formed over the stairs 125 at a thickness ranging from about 50 Å to about 1000 Å, such as from about 50 Å to about 600 Å, or from about 100 Å to about 500 Å. The thickness of the etch stop material 130 on the stairs 125 may be substantially uniform. Since the etch stop material 130 is not substantially removed by the etch chemistry used to remove the nitride materials 120 of the tiers 110, the thickness of the etch stop material 130 may be minimal and yet still provide desired etch stop properties.

The etch stop material 130 may be a carbon-doped silicon nitride including from about 1 wt % of carbon to about 30 wt % of carbon, such as from about 1 wt % of carbon to about 20 wt % of carbon, from about 2 wt % of carbon to about 20 wt % of carbon, from about 2 wt % of carbon to about 15 wt % of carbon, from about 5 wt % of carbon to about 15 wt % of carbon, from about 1 wt % of carbon to about 12 wt % of carbon, from about 5 wt % of carbon to about 12 wt % of carbon, from about 8 wt % of carbon to about 12 wt % of carbon, or from about 9 wt % of carbon to about 11 wt % of carbon. The carbon may be present in the silicon nitride at a dopant level. In one embodiment, the carbon-doped silicon nitride includes about 10 wt % of carbon. The carbon-doped silicon nitride may have a substantially homogeneous composition across the thickness of the etch stop material 130. The etch stop material 130 excludes silicon carbon nitride (SiCN), which includes a stoichiometric amount of carbon. Alternatively, the etch stop material 130 may be a high-k dielectric material, such as hafnium oxide.

Another oxide material 135 may be formed over the etch stop material 130, as shown in FIG. 2, to fill in a region overlying the stairs 125. The another oxide material 135 may be selected to be selectively etchable relative to the etch stop material 130 during formation of the contact holes 150 (see FIG. 5). The another oxide material 135 may also be selected to be selectively etchable relative to the nitride materials 120 of the tiers 110. The another oxide material 135 may be a silicon oxide or other insulative material selectively etchable to the etch stop material 130 and the nitride materials 120.

Figure 3:
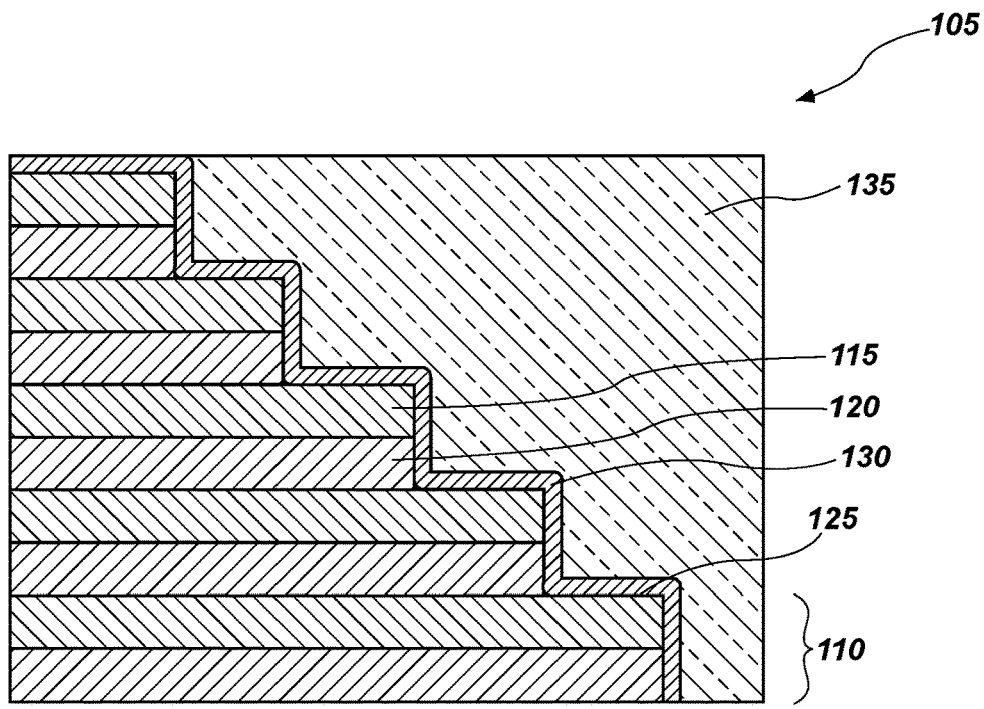

The another oxide material 135 may be planarized, such as by a chemical mechanical planarization (CMP) process, to expose an upper surface of the etch stop material 130 over an uppermost tier 110, as shown in FIG. 3. The upper surface of the etch stop material 130 may be substantially coplanar with an upper surface of the another oxide material 135.

Figure 4:
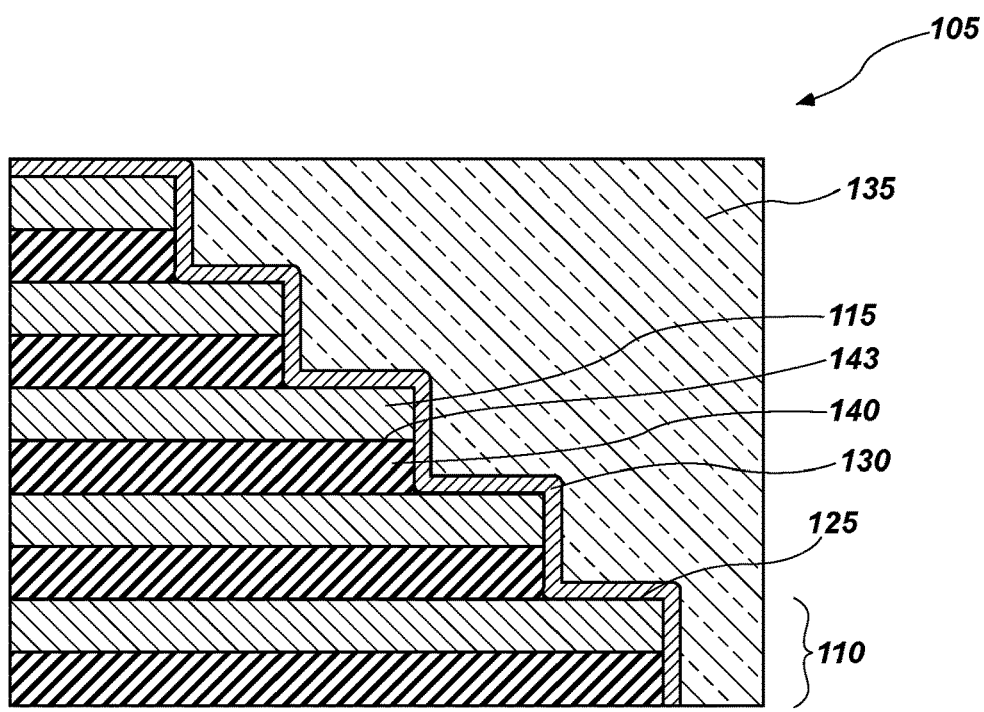

The nitride materials 120 of the staircase structure 105 are removed and conductive materials 140 formed in the resulting spaces (not shown) by a so-called "replacement gate" process, as shown in FIG. 4. The spaces formed by the removal of the nitride materials 120 may be filled with the conductive materials 140 to form, for example, wordlines. The nitride materials 120 may be removed, for example, using a wet etch process (e.g., an isotropic etch process). By way of example only, the nitride materials 120 may be removed using a phosphorus-based etch chemistry, such as a phosphoric acid-based chemistry, or other conventional wet etch chemistry that exhibits etch selectivity for the nitride materials 120 relative to the oxide materials 115 and the another oxide material 135. Such phosphoric acid chemistries are known in the art and are not described in detail herein. The phosphorus-based etch chemistry may remove the nitride materials 120 without removing the etch stop material 130. Phosphorus-based etch chemistries that include phosphoric acid are aggressive due to the acidic conditions. Since both the nitride materials 120 of the staircase structure 105 and the etch stop material 130 are silicon nitride-based, it was surprising that the etch stop material 130 is not removed by the phosphorus-based etch chemistry used to remove the nitride materials 120 during the replacement gate process. It was also surprising that the etch stop material 130 is not removed by conventional etch chemistries used to remove nitride materials.

The conductive materials 140 of the replacement gate process may, for example, be a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. In some embodiments, the conductive materials 140 are formed from tungsten. The conductive materials 140 may be formed by conventional techniques, which are not described herein. Depending on the material selected and deposition technique used, voids in the conductive materials 140 may be formed. In conventional processes of connecting the conductive materials 140 to the contacts 155, these voids increase the likelihood of punch through when the contact holes 150 are formed. However, using the etch stop material 130 according to embodiments of the disclosure prevents or reduces punch through into the conductive materials 140. The conductive materials 140 of the tiers 110 are electrically connected to access lines (not shown) by contacts 155 (see FIG. 6) on contact regions 143 of the stairs 125. The contact regions 143 correspond to locations under the stairs 125 and on the conductive materials 140, upon which the contacts 155 (e.g., interconnects) are formed to provide electrical access to the conductive materials.

Figure 5:
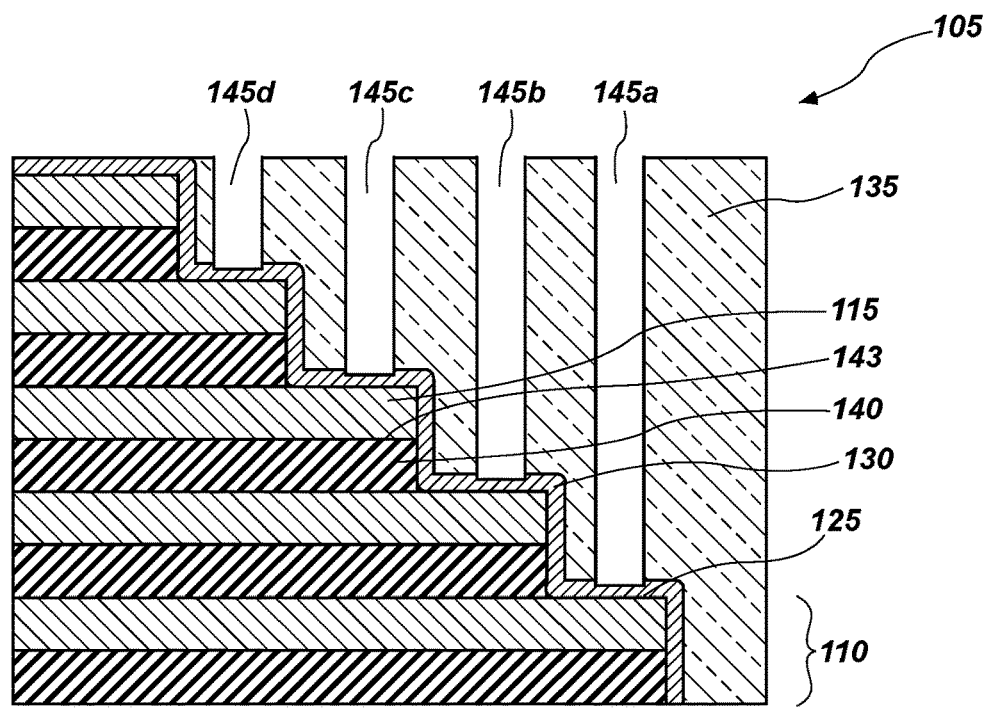

Openings 145 may be formed in the another oxide material 135, as shown in FIG. 5. The openings 145 extend from the upper surface of the another oxide material 135 to an upper surface of the etch stop material 130 overlying each of the stairs 125. The openings 145 have different depths depending on the depth of the conductive material 140 to which each opening 145 extends. For example, the openings 145a, 145b that extend toward the conductive materials 140 at the lower tiers 110 of the staircase structure 105 are deeper than the openings 145c, 145d that extend toward the conductive materials 140 at the upper tiers 110 of the staircase structure 105. The openings 145 may have a depth within a range of from about 1 μm to about 15 μm, such as from about 2 μm to about 12 μm, from about 3 μm to about 11 μm, from about 5 μm to about 15 μm, or from about 1 μm to about 10 μm. As described in more detail below, the openings 145 are subsequently extended through the oxide materials 115 and into the conductive materials 140 to form the contact holes 150 (see FIG. 6).

The openings 145 may be formed in locations where the contacts 155 are subsequently to be formed. To form the openings 145, portions of the another oxide material 135 are removed until the upper surface of the etch stop material 130 is exposed at a bottom portion of the openings 145. The another oxide material 135 may be selectively etchable relative to the oxide materials 115 and conductive materials 140 of the tiers 110 such that the desired portions of the another oxide material 135 are removed without substantially removing portions of the oxide materials 115 and conductive materials 140 of the staircase structure 105. The openings 145 are formed by conventional photolithography techniques and are not described in detail herein. A dry etch process (e.g., an anisotropic etch process) may be used to form the openings 145, with a dry etch chemistry that exhibits a high etch selectivity to the oxide materials 115 and conductive materials 140 of the tiers 110 and to the etch stop material 130. The dry etch process may be conducted for an amount of time sufficient to form the openings 145 having the deeper depths and the openings 145 having the shallower depths without substantially removing the etch stop material 130. Since the etch stop material 130 is substantially resistant to plasma etch conditions of the dry etch process, the openings 145 having different depths, such as the shallower depths and the deeper depths, may be formed using a single mask and with substantially no etching into the oxide materials 115 and conductive materials 140 of the tiers 110. The openings 145 having the different depths may also be formed at substantially the same time. Since the etch stop material 130 prevents etching into the oxide materials 115 and the conductive materials 140 underlying the etch stop material 130, shorting between horizontally adjacent conductive materials 140 is reduced. The etch stop material 130 also reduces the likelihood that any voids in the conductive materials 140 will become problematic by reducing the likelihood of punch through into the conductive materials 140.

Figure 6:
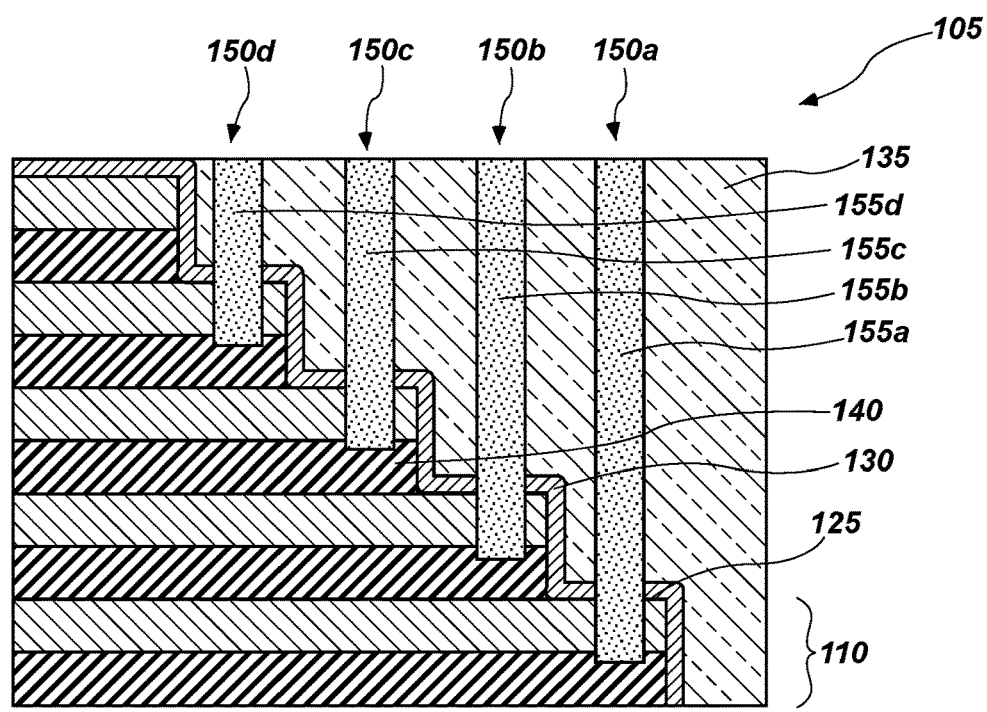

After exposing the etch stop material 130 through the openings 145, the exposed portions of the etch stop material 130 are removed to expose the underlying oxide materials 115, as shown in FIG. 6. The etch chemistry used to remove the exposed portions of the etch stop material 130 may be a different dry etch chemistry than that used to form the openings 145. Alternatively, the same dry etch chemistry may be used and conducted for an additional amount of time. Portions of the underlying oxide material 115 and conductive material 140 are then removed, extending the openings 145 through the oxide material 115 and into the conductive material 140 to form the contact holes 150. As described above for the openings 145, the contact holes 150 may have different depths depending on the depth of the conductive material 140 to which each contact hole 150 extends. The etch chemistry used to form the contact holes 150 may be the same as or different from the etch chemistry used to remove the portions of the etch stop material 130. For instance, the etch chemistry used to form the contact holes 150 may include two etch chemistries, one to remove the etch stop material 130 and another to remove the portions of the oxide materials 115 and the conductive materials 140. The contact holes 150 may have a depth within a range of from about 1 µm to about 15 µm, such as from about 2 µm to about 12 µm, from about 3 µm to about 11 µm, from about 5 µm to about 15 µm, or from about 1 µm to about 10 µm. The difference in depth between shallower contact holes 150 and the deeper contact holes 150 may be about 10 µm.

The contact holes 150 may then be filled with another conductive material, forming contacts 155, which provide electrical contact to the conductive materials 140 of the staircase structure 105 at each level. The contacts 155 have different heights depending on the depth of the conductive material 140 to which each contact 155 is connected. For example, the contacts 155a, 155b that contact the conductive materials 140 at the lower tiers 110 of the staircase structure 105 are taller than the contacts 155c, 155d that contact the conductive materials 140 at the upper tiers 110 of the staircase structure 105. The contacts 155 may have heights within a range of from about 1 µm to about 15 µm, such as from about 2 µm to about 12 µm, from about 3 µm to about 11 µm, from about 5 µm to about 15 µm, or from about 1 µm to about 10 µm. The contacts 155 may be electrically connected with the conductive materials 140 at each level of the staircase structure 105. The another conductive material of the contacts 155 may be polysilicon, doped polysilicon (using dopants such as arsenic or phosphorus), or a metal including, but not limited to, aluminum (Al), copper (Cu), tungsten (W), titanium (Ti), cobalt (Co), or nickel (Ni).

The etch stop material 130 in the staircase structure 105 provides a larger margin for forming the openings 145 and contact holes 150 using the etch processes. By utilizing the etch stop material 130, the openings 145 and contact holes 150 in the staircase structure 105 may be formed at different depths using dry etch processes, enabling the contacts 155 to be formed to the conductive materials 140 of the staircase structure 105 at each level. The etch stop material 130 also enables the deeper openings 145 and deeper contact holes 150 to be formed without overetching the shallower openings 145 and shallower contact holes 150.

Figure 7:
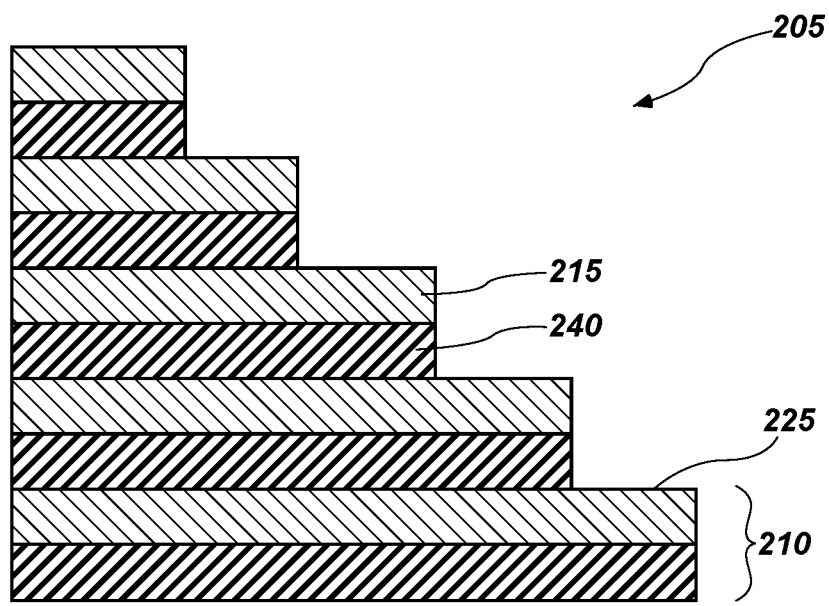
FIGS. 7-10 are cross-sectional views showing the fabrication process of a staircase structure in accordance with other embodiments of the disclosure.
Figure 8:
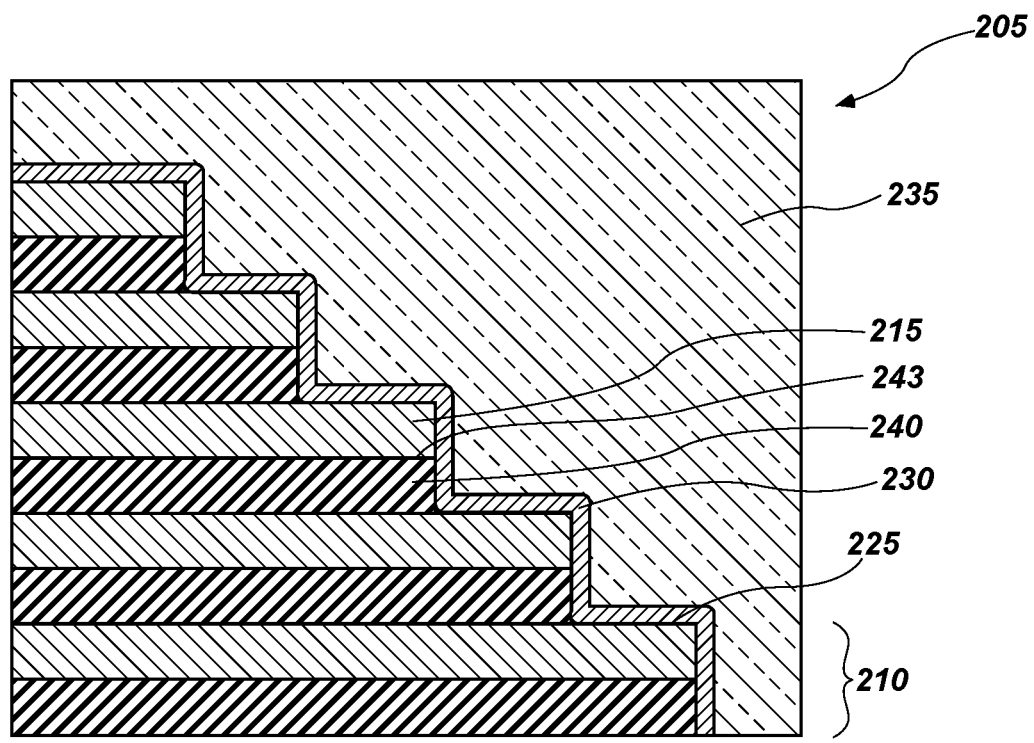
Figure 9:
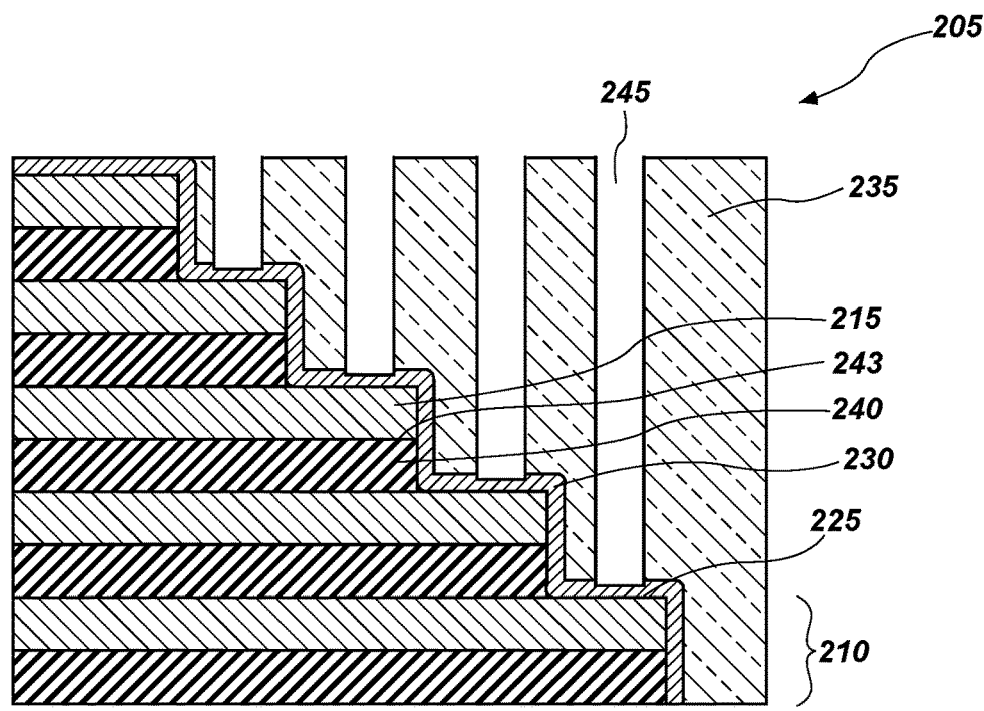
Figure 10:
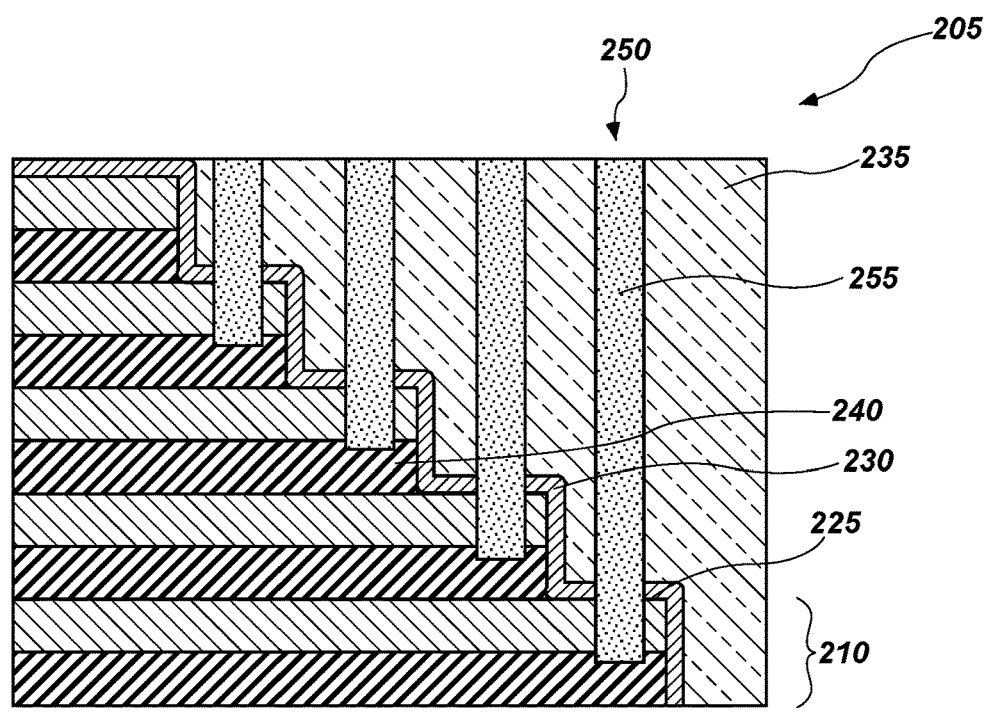
Figure 11:
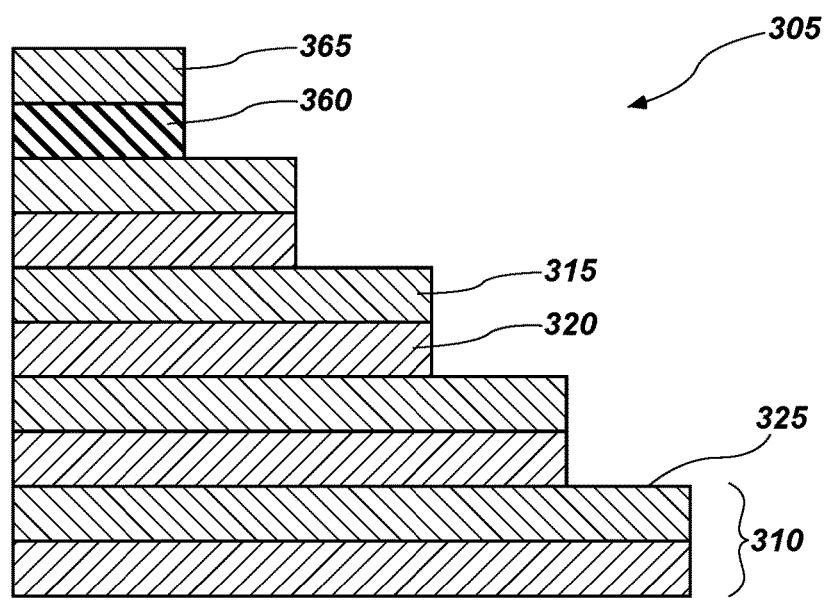
FIGS. 11-17 are cross-sectional views showing the fabrication process of a staircase structure in accordance with yet other embodiments of the disclosure.

While FIGS. 1-6 describe and illustrate a 3D NAND Flash memory device formed by a replacement gate process, embodiments of the disclosure may be used to form a 3D NAND Flash memory device by a floating gate process, where conductive materials are present instead of the nitride materials 120 of the replacement gate process. As shown in FIG. 7, the staircase structure 205 includes tiers 210 of alternating oxide materials 215 and conductive materials 240 on a substrate (not shown). The alternating oxide materials 215 and conductive materials 240 are formed on the substrate and each tier 210 is patterned to form the stairs 225 of the staircase structure 205. By conducting repeated etch and trim acts, the stepped profile (e.g., stairs 225) of the staircase structure 205 are formed. The formation and patterning of the oxide materials 215 and conductive materials 240 are conducted by conventional techniques and are not described in detail herein. The oxide materials 215 and the conductive materials 240 are selected to be selectively etchable relative to one another. In some embodiments, the oxide material 215 is a silicon oxide ($SiO_x$), such as silicon dioxide ($SiO_2$), and the conductive material 240 is tungsten (W). Since the conductive materials 240 are already present in the staircase structure 205, replacement of nitride materials 120, as described above in relation to FIG. 1, is not needed. The conductive materials 240 of the tiers 210 are electrically connected to access lines (not shown) by contacts 255 (see FIG. 10) on contact regions 243 of the stairs 225. The contact regions 243 correspond to locations under the stairs 225 and on the conductive materials 240, upon which the contacts 255 (e.g., interconnects) are formed to provide electrical access to the conductive materials As shown in FIG. 8, the etch stop material 230 is formed over the alternating oxide materials 215 and conductive materials 240, another oxide material 235 is formed in the region overlying the stairs 125, and the another oxide material 235 is planarized in substantially the same manner as described above for FIGS. 2 and 3. As shown in FIGS. 9 and 10, openings 245 and contact holes 250 are then formed in substantially the same manner as described above for FIGS. 5 and 6. The contact holes 250 may be filled with the another conductive material, forming contacts 255 to the conductive materials 240 of the staircase structure 205. The another conductive material of the contacts 255 may be polysilicon, doped polysilicon (using dopants such as arsenic or phosphorus), or a metal including, but not limited to, aluminum (Al), copper (Cu), tungsten (W), titanium (Ti), cobalt (Co), or nickel (Ni).

Figure 12:
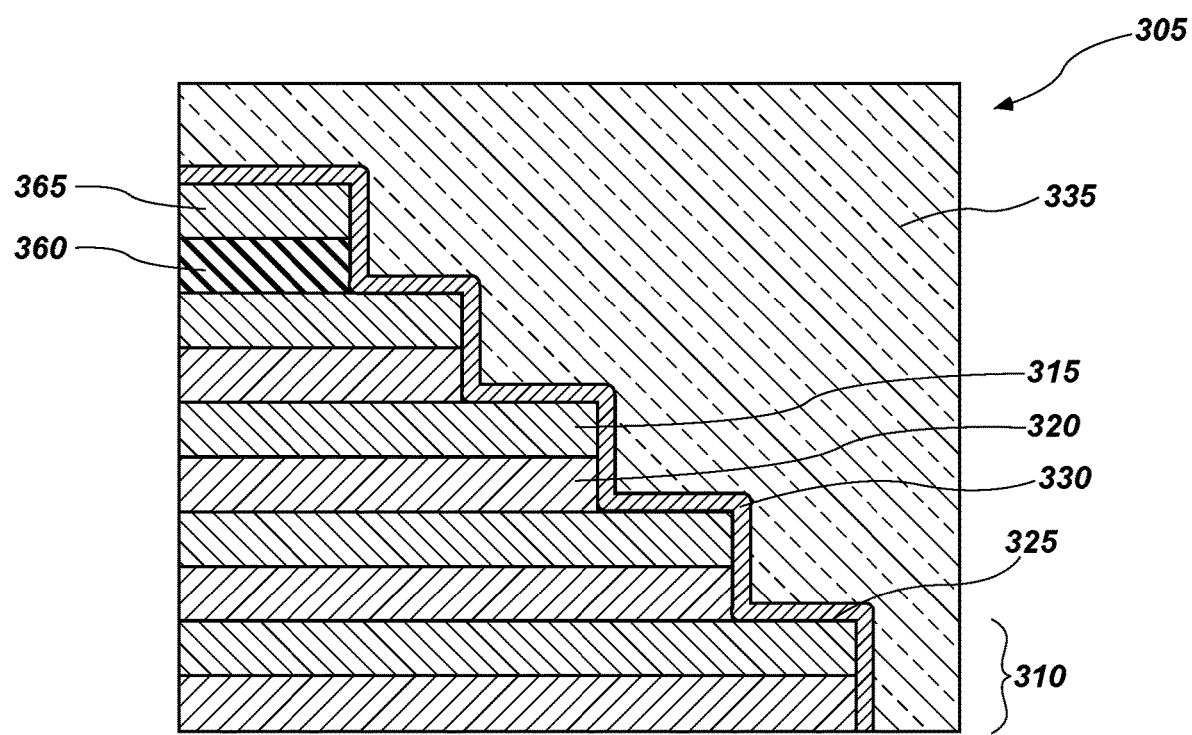
Figure 13:
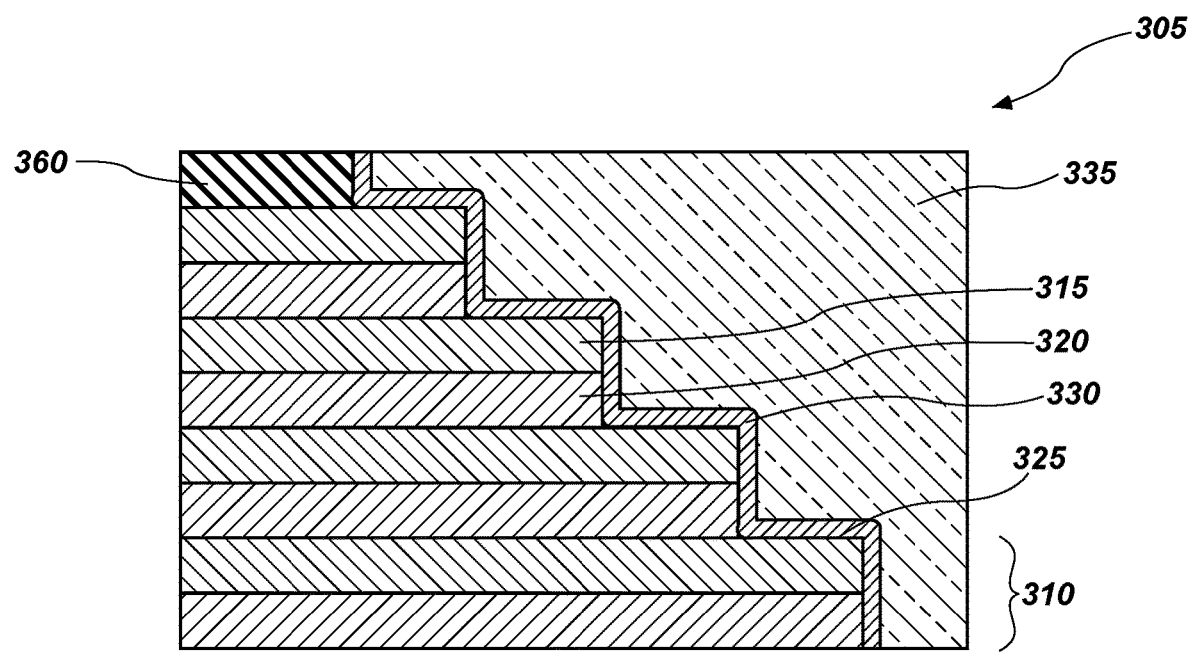

In another embodiment illustrated in FIGS. 11-17, the staircase structure 305 may include the alternating oxide materials 315 and nitride materials 320, formed in the region overlying the stairs 325, with a polysilicon material 360 formed over the uppermost oxide material 315. The oxide materials 315 and nitride materials 320 of tiers 310 are formed in substantially the same manner as described above for FIG. 1. An additional oxide material 365 may be formed over the polysilicon material 360. The polysilicon material 360 and the additional oxide material 365 are formed by conventional techniques, which are not described in detail herein. As shown in FIG. 12, the etch stop material 330 may be formed over the staircase structure 305, including over the additional oxide material 365 and the polysilicon material 360. The etch stop material 330 is formed in substantially the same manner as described above for FIG. 2. The another oxide material 335 may be formed over the etch stop material 330 as previously described, and planarized, such as by a CMP process, to expose an upper surface of the polysilicon material 360, as shown in FIG. 13. The formation of the another oxide material 335 and subsequent planarization may be conducted in substantially the same manner as described above for FIG. 3, except that the surface of the another oxide material 335 is coplanar with the upper surface of the polysilicon material 360. During the planarization, a portion of the etch stop material 330 overlying the additional oxide material 365 and the polysilicon material 360 may be removed, as well as the additional oxide material 365 and a portion of the polysilicon material 360.

Figure 14:
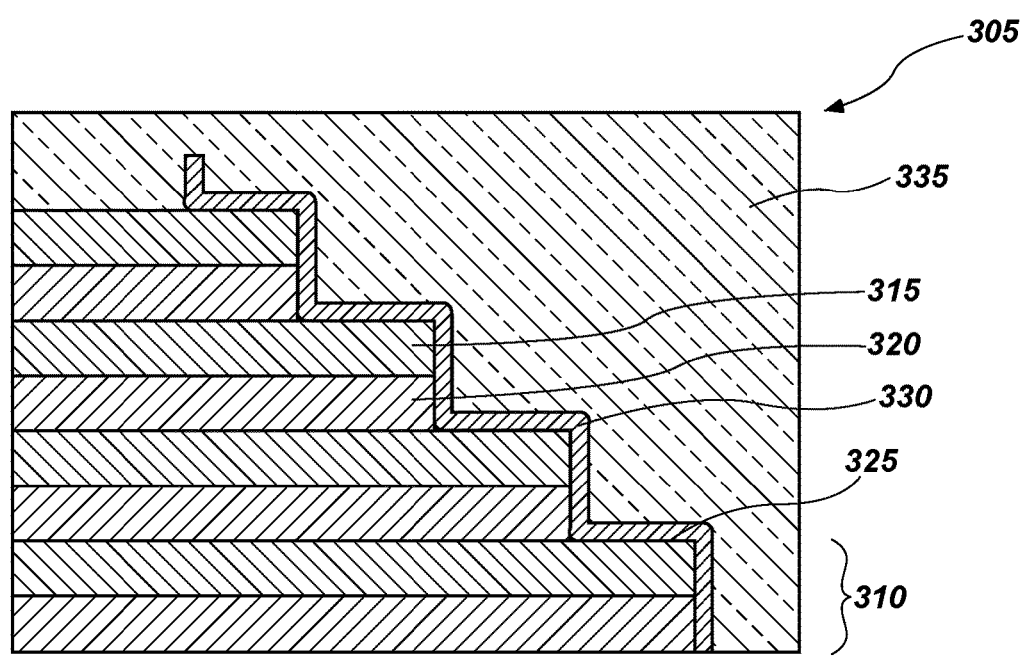
Figure 15:
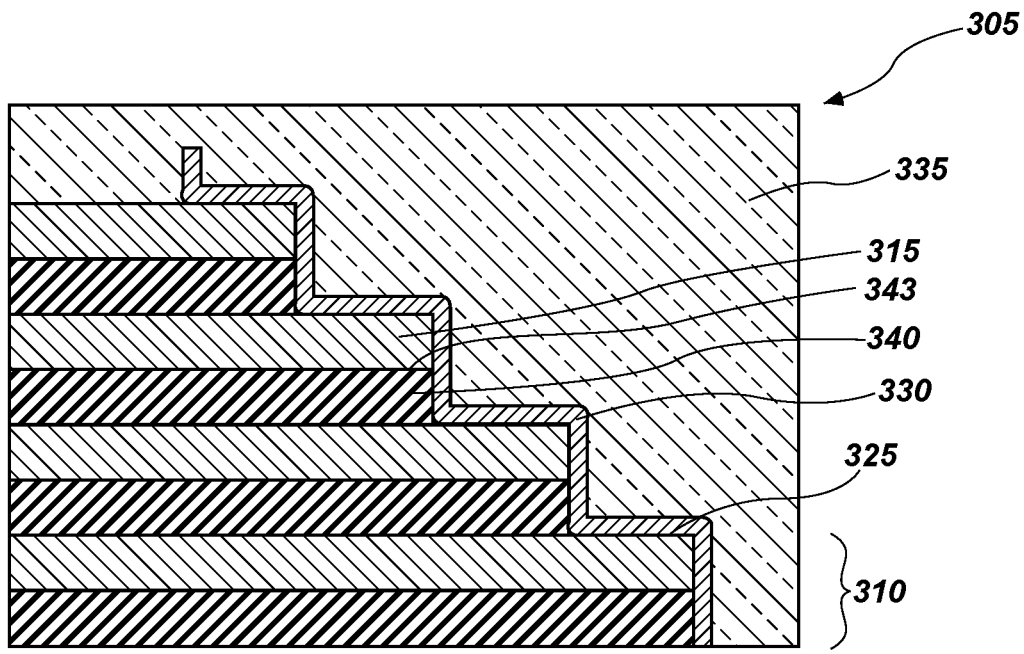
Figure 16:
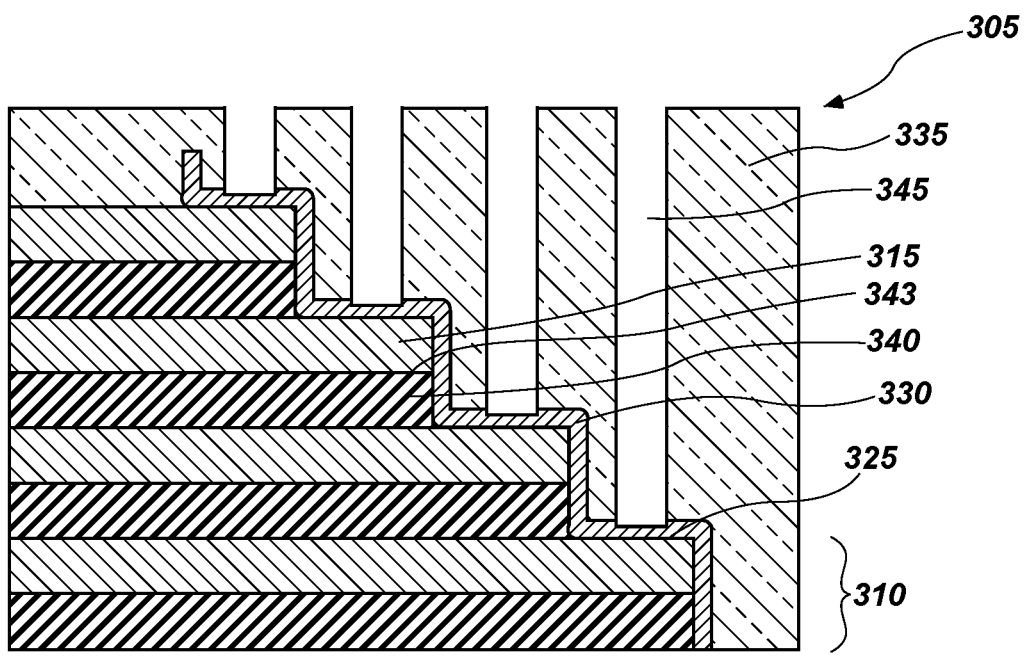
Figure 17:
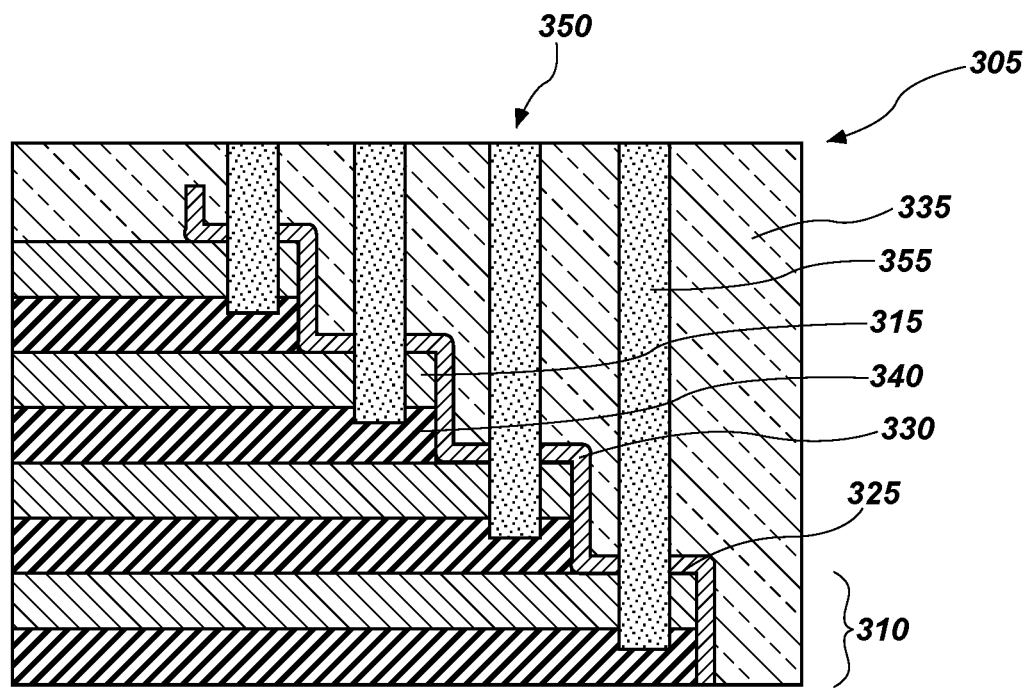

The polysilicon material 360 is then removed and an additional portion of the another oxide material 335 is formed over the uppermost oxide material 315, as shown in FIG. 14. The nitride materials 320 may then be removed and replaced with the conductive materials 340 by the replacement gate process, as shown in FIG. 15. The replacement gate process may be conducted in substantially the same manner as described above for FIG. 4. The conductive materials 340 of the tiers 310 are electrically connected to access lines (not shown) by contacts 355 (see FIG. 17) on contact regions 343 of the stairs 325. The contact regions 343 correspond to locations under the stairs 325 and on the conductive materials 340, upon which the contacts 355 (e.g., interconnects) are formed to provide electrical access to the conductive materials. As shown in FIG. 16, the openings 345 are formed in the another oxide material 335, stopping on the etch stop material 330. The openings 345 are formed in substantially the same manner as described above for FIG. 5. The openings 345 are then extended through the etch stop material 330 and oxide material 315 and into the conductive material 340 to form the contact holes 350, as shown in FIG. 17. The contact holes 350 are formed in substantially the same manner as described above for FIG. 6. The contact holes 350 may be filled with the another conductive material, forming contacts 355 that extend to the conductive materials 340 of the staircase structure 305. The another conductive material of the contacts 355 may be polysilicon, doped polysilicon (using dopants such as arsenic or phosphorus), or a metal including, but not limited to, aluminum (Al), copper (Cu), tungsten (W), titanium (Ti), cobalt (Co), or nickel (Ni).

Accordingly, a method of forming a semiconductor device structure is disclosed. The method comprises forming stairs in a staircase structure comprising alternating dielectric levels and conductive levels. A carbon-doped silicon nitride is formed over the stairs. An oxide material is formed over the carbon-doped silicon nitride and openings are formed in the oxide material. The openings extend to the carbon-doped silicon nitride. The carbon-doped silicon nitride is removed to extend the openings into the conductive levels of the staircase structure.

Accordingly, another method of forming a semiconductor device structure is disclosed. The method comprises forming stairs in a staircase structure comprising tiers of dielectric levels and nitride materials. An etch stop material comprising carbon-doped silicon nitride is formed over the stairs and an oxide material is formed over the etch stop material. The nitride materials of the tiers are replaced with conductive levels. Openings are formed in the oxide material to expose the etch stop material overlying contact regions of the conductive levels. The openings are extended through the etch stop material and the dielectric levels and to the contact regions of the conductive levels to form contact holes, which are filled with a conductive material to form contacts.

As shown in FIGS. 6, 10, and 17, the staircase structures 105, 205, 305 include the contacts 155, 255, 355, the conductive materials 140, 240, 340, and the etch stop materials 130, 230, 330. The contacts 155, 255, 355 extend through the another oxide materials 135, 235, 335, the etch stop materials 130, 230, 330, and the conductive materials 140, 240, 340. The contacts 155, 255, 355 extend in a direction perpendicular to the direction of the conductive materials 140, 240, 340. After forming the contacts 155, 255, 355, additional process acts may be conducted to form a complete 3D semiconductor device structure including one or more staircase structures 105, 205, 305 according to embodiments of the disclosure, such as a 3D floating gate NAND Flash memory device or a 3D replacement gate NAND Flash memory device. The additional process acts may be conducted by conventional techniques, which are not described in detail herein. For example, a channel material may be formed and extend through the alternating oxide materials 115, 215, 315 and conductive materials 140, 240, 340, and memory cells may be formed along the channel material. Such process acts to form the 3D NAND Flash memory device are known in the art and are not described in detail herein.

Accordingly, a semiconductor device structure is disclosed that comprises tiers of alternating dielectric levels and conductive levels and a carbon-doped silicon nitride over the tiers of the staircase structure. The carbon-doped silicon nitride excludes silicon carbon nitride.

The contacts 155, 255, 355 of the staircase structures 105, 205, 305 may electrically couple components (not shown) of a semiconductor device structure including the staircase structures 105, 205, 305 to each other. The components of the semiconductor device structure may include vertical strings of memory cells coupled to each other in series, data lines (e.g., bit lines), a source tier, access lines, first select gates (e.g., upper select gates, drain select gates (SGDs)), select lines, a second select gate (e.g., a lower select gate, a source select gate (SGS)), and additional contact structures.

The vertical strings of memory cells extend vertically and orthogonal to conductive lines and tiers 110, 210, 310 and the contacts 155, 255, 355 may electrically couple the components to each other. For instance, the select lines may be coupled to the first select gates, and the access lines may be coupled to the tiers 110, 210, 310. The semiconductor device structure may also include a control unit, which may include one or more of string driver circuitry, pass gates, circuitry for selecting gates, circuitry for selecting conductive lines (e.g., the data lines, the access lines), circuitry for amplifying signals, and circuitry for sensing signals. The control unit may, for example, be electrically coupled to the data lines, source tier, access lines, first select gates, and second select gate, for example.

While embodiments herein are described and illustrated as being used with staircase structures 105, 205, 305, the methods of the present disclosure may be used in the formation of any semiconductor device structures in which openings of different depths are to be formed in alternating materials having different etch selectivities, such as in oxide materials and nitride materials or in oxide materials and conductive materials. The carbon-doped silicon nitride may be used as an etch stop material to form the openings at different depths through the oxide materials and nitride materials or through the oxide materials and conductive materials.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device comprising:
   a staircase structure comprising tiers of alternating dielectric levels and conductive levels;
   a carbon-doped silicon nitride over the tiers of the staircase structure, the carbon-doped silicon nitride excluding silicon carbon nitride comprising a stoichiometric amount of carbon; and
   contacts in electrical contact with the conductive levels of the tiers and extending through the dielectric levels and into the conductive levels of the tiers, wherein bottom surfaces of the contacts are within the conductive levels of the tiers:
      each contact exhibiting substantially the same width from a top surface of the respective contact to the bottom surface of the respective contact; and
      substantially all of the conductive levels of the staircase structure in electrical contact with a respective contact.

2. The semiconductor device of claim 1, wherein the carbon-doped silicon nitride is in direct contact with the dielectric levels of each tier.

3. The semiconductor device of claim 1, wherein the carbon-doped silicon nitride is in direct contact with horizontal surfaces of the dielectric levels of each tier and in direct contact with vertical surfaces of the dielectric levels and of the conductive levels of each tier.

4. The semiconductor device of claim 1, wherein the carbon-doped silicon nitride comprises silicon nitride and from about 1% by weight of carbon to about 15% by weight of carbon.

5. The semiconductor device of claim 1, wherein the carbon-doped silicon nitride comprises silicon nitride and from about 5% by weight of carbon to about 15% by weight of carbon.

6. The semiconductor device of claim 1, wherein the carbon-doped silicon nitride comprises silicon nitride and from about 8% by weight of carbon to about 12% by weight of carbon.

7. The semiconductor device of claim 1, wherein the carbon-doped silicon nitride comprises silicon nitride and about 10% by weight of carbon.

8. The semiconductor device of claim 1, wherein the carbon-doped silicon nitride has a thickness between about 100 Å and about 500 Å.

9. The semiconductor device of claim 1, wherein the carbon-doped silicon nitride has a uniform thickness.

10. The semiconductor device of claim 1, wherein at least one of the contacts has a different height than the height of another of the contacts.

11. The semiconductor device of claim 1, wherein each contact of the contacts is electrically connected to a different conductive level of the tiers.

12. The semiconductor device of claim 1, further comprising a channel material extending through at least a portion of the tiers of the dielectric levels and the conductive levels.

13. The semiconductor device of claim 12, further comprising memory cells along a length of the channel material.

14. A method of forming a semiconductor device, comprising:
   forming stairs in a staircase structure comprising tiers of alternating dielectric levels and conductive levels;
   forming a carbon-doped silicon nitride over the stairs, the carbon-doped silicon nitride excluding silicon carbon nitride comprising a stoichiometric amount of carbon;
   forming an oxide material over the carbon-doped silicon nitride;
   forming openings in the oxide material, the openings extending to the carbon-doped silicon nitride;
   removing portions of the carbon-doped silicon nitride to extend the openings into the conductive levels of the staircase structure; and
   forming contacts in electrical contact with the conductive levels of the tiers and extending through the dielectric levels and into the conductive levels of the tiers, wherein bottom surfaces of the contacts are within the conductive levels of the tiers, each contact exhibiting substantially the same width from a top surface of the respective contact to a bottom surface of the respective contact and substantially all of the conductive levels of the staircase structure in electrical contact with a respective contact.

15. The method of claim 14, wherein forming a carbon-doped silicon nitride over the stairs comprises forming silicon nitride comprising from about 5% by weight of carbon to about 15% by weight of carbon over the stairs.

16. The method of claim 14, wherein forming openings in the oxide material comprises forming the openings comprising different depths.

17. The method of claim 14, wherein forming openings in the oxide material comprises forming the openings comprising depths of from about 1 μm to about 15 μm.

18. The method of claim 14, wherein forming openings in the oxide material comprises forming the openings without substantially removing the carbon-doped silicon nitride.

19. The method of claim 14, wherein forming stairs in a staircase structure comprising alternating dielectric levels and conductive levels comprises forming tiers of alternating dielectric materials and nitride materials, removing portions of the alternating dielectric materials and nitride materials to form the stairs, and replacing the nitride materials of the tiers with conductive levels.

20. A method of forming a semiconductor device, comprising:
- forming stairs in a staircase structure comprising tiers of alternating dielectric levels and nitride materials;
- forming an etch stop material comprising carbon-doped silicon nitride over the stairs, the carbon-doped silicon nitride excluding silicon carbon nitride comprising a stoichiometric amount of carbon;
- forming an oxide material over the etch stop material;
- replacing the nitride materials of the tiers with conductive levels to form a staircase structure comprising tiers of alternating dielectric levels and conductive levels;
- forming openings though the oxide material to expose the etch stop material overlying contact regions of the conductive levels;
- extending the openings through the etch stop material and the dielectric levels and into the contact regions of the conductive levels to form contact holes; and
- filling the contact holes with a conductive material to form contacts in electrical contact with the conductive levels, each of the contacts having substantially the same width from a top surface of the respective contact to a bottom surface of the respective contact, substantially all of the conductive levels of the staircase structure in electrical contact, with a respective contact, and the bottom surfaces of the contacts are within the conductive levels of the tiers.

21. The method of claim 20, wherein forming openings though the oxide material comprises forming shallower openings and deeper openings though the oxide material.

22. The method of claim 21, wherein extending the openings comprises forming contact holes comprising shallower depths and deeper depths.

23. The method of claim 20, wherein filling the contact holes with a conductive material to form contacts comprises forming the contacts comprising different heights.

24. The method of claim 20, wherein filling the contact holes with a conductive material to form contacts comprises electrically connecting each of the contacts with the conductive levels of each tier.

25. The method of claim 20, wherein filling the contact holes with a conductive material to form contacts comprises forming the contacts comprising shallower contacts and deeper contacts.

26. The semiconductor device of claim 1, wherein each contact comprises a different height than a height of another contact.

27. A semiconductor device comprising:
- a staircase structure comprising tiers of alternating dielectric levels and conductive levels;
- a carbon-doped silicon nitride over the tiers of the staircase structure, the carbon-doped silicon nitride excluding silicon carbon nitride comprising a stoichiometric amount of carbon and a portion of the carbon-doped silicon nitride extending perpendicularly from an uppermost dielectric level of the staircase structure; and
- contacts extending into the conductive levels of the tiers and in electrical contact with the conductive levels of the tiers, the contacts comprising:
  - a width of each contact substantially uniform along a height of the respective contact; and
  - each conductive level in electrical contact with a respective contact.

* * * * *